United States Patent
Choi et al.

(10) Patent No.: US 10,338,758 B2
(45) Date of Patent: Jul. 2, 2019

(54) TOUCH SENSING ELECTRODE STRUCTURE AND TOUCH SENSOR INCLUDING THE SAME

(71) Applicant: DONGWOO FINE-CHEM CO., LTD., Jeollabuk-do (KR)

(72) Inventors: Byung Jin Choi, Gyeonggi-do (KR); Sung Jin Noh, Gyeonggi-do (KR); Min Soo Seo, Gyeonggi-do (KR); Cheol Hun Lee, Gyeonggi-do (KR); Eung Goo Cho, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 15/859,976

(22) Filed: Jan. 2, 2018

(65) Prior Publication Data
US 2018/0188852 A1 Jul. 5, 2018

(30) Foreign Application Priority Data

Jan. 5, 2017 (KR) .......... 10-2017-0001678
Jan. 5, 2017 (KR) .......... 10-2017-0001679

(51) Int. Cl.
*G06F 3/044* (2006.01)
*H01L 27/32* (2006.01)
*G02F 1/1333* (2006.01)

(52) U.S. Cl.
CPC ............ *G06F 3/044* (2013.01); *H01L 27/323* (2013.01); *G02F 1/13338* (2013.01);
(Continued)

(58) Field of Classification Search
CPC . G06F 2203/04103; G06F 2203/04111; G06F 2203/04112; G06F 3/044;
(Continued)

(56) References Cited

U.S. PATENT DOCUMENTS

2016/0092004 A1* 3/2016 Yoshiki .................. G06F 3/047
345/174
2016/0117016 A1* 4/2016 Wu .......................... G06F 3/044
345/174

(Continued)

FOREIGN PATENT DOCUMENTS

CN 103827794 A 5/2014
CN 105487701 A 4/2016
(Continued)

OTHER PUBLICATIONS

Office action dated Oct. 29, 2018 from Japan Intellectual Property Office in a counterpart Japanese Patent Application No. 2017-253495 (all the cited references are listed in this IDS.) (English translation is submitted herewith).

*Primary Examiner* — Richard J Hong
(74) *Attorney, Agent, or Firm* — The PL Law Group, PLLC (57) ABSTRACT

A touch sensing electrode structure includes an electrode line and connecting electrodes. The electrode line extends in a first direction as a zigzag line shape, and a plurality of the electrode lines are arranged along a second direction that crosses the first direction. The connecting electrodes extend in the second direction and connect neighboring ones of the electrode lines to form a plurality of concave polygonal patterns.

17 Claims, 9 Drawing Sheets

(52) U.S. Cl.
CPC ............ *G06F 2203/04102* (2013.01); *G06F 2203/04103* (2013.01); *G06F 2203/04111* (2013.01); *G06F 2203/04112* (2013.01)

(58) Field of Classification Search
CPC ...... G06F 3/0416; G06F 3/0412; G06F 3/041; G06F 3/047; H01L 27/323
See application file for complete search history.

(56) References Cited

U.S. PATENT DOCUMENTS

| | | | |
|---|---|---|---|
| 2016/0195983 A1* | 7/2016 | Miyake | G06F 3/0416 345/174 |
| 2016/0224181 A1* | 8/2016 | Kim, II | G06F 3/044 |
| 2017/0147128 A1* | 5/2017 | Ishizaki | G06F 3/0412 |

FOREIGN PATENT DOCUMENTS

| | | | |
|---|---|---|---|
| CN | 106155396 A | * | 11/2016 |
| CN | 106155396 A | | 11/2016 |
| JP | 2012-163933 A | | 8/2012 |
| JP | 2014-241132 A | | 12/2014 |
| KR | 10-2014-0092366 A | | 7/2014 |
| TW | 201512936 A | | 4/2015 |
| TW | 201606605 A | | 2/2016 |

\* cited by examiner

TOUCH SENSING ELECTRODE STRUCTURE AND TOUCH SENSOR INCLUDING THE SAME

CROSS-REFERENCE TO RELATED APPLICATION AND CLAIM OF PRIORITY

This application claims priority to Korean Patent Applications No. 10-2017-0001678 filed on Jan. 5, 2017, and No, 10-2017-0001679 filed on Jan. 5, 2017 in the Korean Intellectual Property Office (KIPO), the entire disclosure of which is incorporated by reference herein.

BACKGROUND

1. Field

The present invention relates to a touch sensing electrode structure and a touch sensor including the same. More particularly, the present invention relates to a touch sensing electrode structure including a plurality of different patterns and a touch sensor including the same.

2. Description of the Related Art

As information technologies are being developed, various demands in display devices having thinner dimension, light-weight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel capable of inputting a user's direction by selecting an instruction displayed on a screen is also developed. The touch panel may be combined with the display device so that display and information input functions may be implemented in one electronic device.

Further, as the display device has become thinner, a flexible display device having a bending or folding property is being developed. Thus, the touch panel having the flexible property is also required to be employed to the flexible display device.

If the touch panel is inserted in the display device, an image quality may be degraded when electrode patterns of the touch panel are viewed by the user. Thus, the touch panel having a thin thickness and flexibility as well as improved optical property is needed.

For example, a touch screen panel including a touch sensor is employed in various image display devices as disclosed in Korean Patent Publication No. 2014-0092366. However, demands for a thin-layered touch sensor or touch panel having improved mechanical and optical properties are continuously increasing.

SUMMARY

According to an aspect of the present invention, there is provided a touch sensing electrode structure having improved optical and electrical properties.

According to an aspect of the present invention, there is provided a touch sensor which includes a touch sensing electrode structure having improved optical and electrical properties.

According to an aspect of the present invention, there is provided an image display device which includes a touch sensor having improved optical and electrical properties.

The above aspects of the present inventive concepts will be achieved by the following features or constructions:

(1) A touch sensing electrode structure, including an electrode line extending in a first direction as a zigzag line shape, a plurality of the electrode lines being arranged along a second direction that crosses the first direction, and connecting electrodes which extend in the second direction and connect neighboring ones of the electrode lines to form a plurality of concave polygonal patterns.

(2) The touch sensing electrode structure according to the above (1), wherein the electrode line includes a first electrode pattern and a second electrode pattern which are alternately repeated to cross each other.

(3) The touch sensing electrode structure according to the above (2), wherein the concave polygonal pattern includes a convex portion and a concave portion defined at intersecting regions of the first electrode pattern and the second electrode pattern, wherein the connecting electrode connects the convex portion and the concave portion included in neighboring ones of the concave polygonal patterns.

(4) The touch sensing electrode structure according to the above (2), wherein an inclined angle of the first electrode pattern or the second electrode pattern relative to the first direction is in a range from 10° to 70°.

(5) The touch sensing electrode structure according to the above (4), wherein the inclined angle is in a range from 10° to 50°.

(6) The touch sensing electrode structure according to the above (2), wherein the concave polygonal pattern is defined by two facing first electrode patterns of the first electrode patterns, two facing second electrode patterns of the second electrode patterns, and two facing connecting electrodes of the connecting electrodes.

(7) The touch sensing electrode structure according to the above (2), wherein a mesh structure is defined by the electrode lines and the connecting electrodes, wherein the mesh structure is patterned into an electrode cell including a plurality of merged unit cells.

(8) The touch sensing electrode structure according to the above (7), wherein the unit cell has a convex polygonal shape, and the electrode cell has a concave polygonal shape.

(9) The touch sensing electrode structure according to the above (7), further including traces electrically connected to each electrode cell.

(10) The touch sensing electrode structure according to the above (9), wherein the trace includes at least one of the electrode lines.

(11) The touch sensing electrode structure according to the above (10), wherein the first electrode pattern and the second electrode pattern included in the trace have a length and an inclined angle the same as those of the first electrode pattern and the second electrode pattern included in the electrode cell.

(12) The touch sensing electrode structure according to the above (9), further including dummy electrodes disposed between neighboring traces of the traces.

(13) The touch sensing electrode structure according to the above (12), wherein the dummy electrode extends in the second direction.

(14) The touch sensing electrode structure according to the above (12), wherein the dummy electrodes are connected to one trace of the neighboring traces.

(15) The touch sensing electrode structure according to the above (14), wherein the trace has a zigzag line shape extending in the first direction and including convex portions and concave portions alternately repeated, wherein the dummy electrodes are connected to each convex portion and each concave portion of the one trace.

(16) The touch sensing electrode structure according to the above (12), wherein the dummy electrodes are arranged along the first direction to be alternately connected to the neighboring traces.

(17) The touch sensing electrode structure according to the above (12), wherein the dummy electrodes are isolated from the neighboring traces.

(18) A touch sensor including the touch sensing electrode structure according to any one of the above (1) to (17).

(19) The touch sensor according to the above (18), wherein the touch sensor is a self-capacitance type.

(20) An image display device including the touch sensing electrode structure according to any one of the above (1) to (17).

According to exemplary embodiments of the present invention, a touch sensing electrode structure may include a plurality of concave polygonal patterns arranged in a zigzag configuration using connecting electrodes. Accordingly, a density of electrode patterns may be increased to reduce a resistance and improve a touch sensing resolution.

Further, an angle of the concave polygonal patterns may be adjusted to reduce a visibility of a touch sensing electrode. The touch sensing electrode structure may include an electrode cell in which a plurality of polygonal unit cells are merged so that a difference of capacitances or resistances measured at touched areas may be increased to improve the touch sensing resolution.

In the touch sensing electrode structure or a touch sensor according to some embodiments, a dummy electrode may be formed in a trace region so that electrode configurations and electrode shapes in the trace region and a sensing region may be substantially the same as or similar to each other. Thus, an electrode visibility and a moire phenomenon due to a deviation of the electrode configuration may be suppressed.

For example, the touch sensor may include the touch sensing electrode structure formed at a single layer or a single level, and may be included in an image display device such as a flexible display device.

DETAILED DESCRIPTION

According to exemplary embodiments of the present invention, a touch sensing electrode structure may include concave polygonal patterns defined by a plurality of electrode lines and connecting electrodes, and repeatedly arranged in a zigzag configuration so that an electrode visibility may be reduced, and a touch sensing resolution may be improved.

According to exemplary embodiments of the present invention, a touch sensing electrode structure may include a plurality of electrode lines and connecting electrodes, and may include a dummy electrode in a trace region so that the electrode visibility may be reduced, and the touch sensing resolution may be improved.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Touch Sensing Electrode Structure

Figure 1:
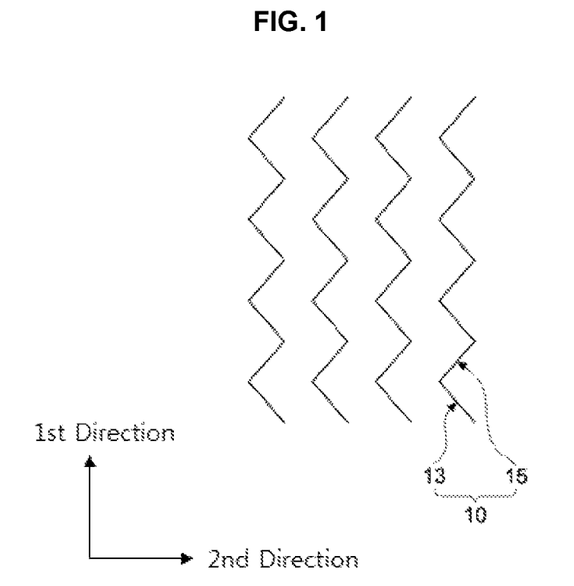
FIGS. 1 and 2 are schematic top plane views illustrating a touch sensing electrode structure in accordance with exemplary embodiments.
Figure 2:
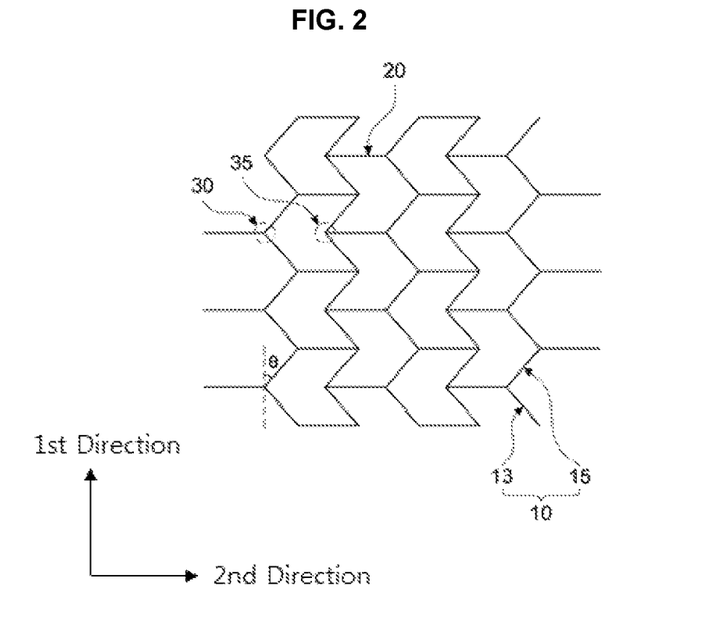

FIGS. 1 and 2 are schematic top plane views illustrating a touch sensing electrode structure in accordance with exemplary embodiments. Specifically, FIGS. 1 and 2 illustrate configurations of individual electrode patterns included in the touch sensing electrode structure.

For convenience of descriptions, FIG. 1 only illustrates individual electrode lines of the touch sensing electrode structure, and FIG. 2 illustrates the electrode lines and connecting electrodes together. For example, FIG. 2 is a top plane view illustrating an electrode structure in a sensing region I of the touch sensing electrode structure.

In FIGS. 1 and 2, two directions crossing each other on the same plane are designated as a first direction and a second direction. For example, the first direction and the second direction may be perpendicular to each other. A direction indicated by an arrow and a reverse direction thereto may be regarded as the same direction. The definition of the directions may be the same throughout all drawings included in the present application.

Referring to FIG. 1, the touch sensing electrode structure may include a plurality of electrode lines 10. For example, each electrode line 10 may extend in the first direction, and a plurality of the electrode lines 10 may be arranged along the second direction.

The electrode line 10 may include a first electrode pattern 13 and a second electrode pattern 15. Each electrode line 10 may include the first electrode patterns 13 and the second electrode patterns 15 which may be repeatedly and alternately arranged. The first electrode patterns 13 and the second electrode patterns 15 may be continuously connected to each other.

The first electrode pattern 13 and the second electrode pattern 15 may cross each other with a predetermined angle. Accordingly, the electrode line 10 may have a shape of a polygonal line or a zigzag line including a plurality of inflected portions.

Figure 6:
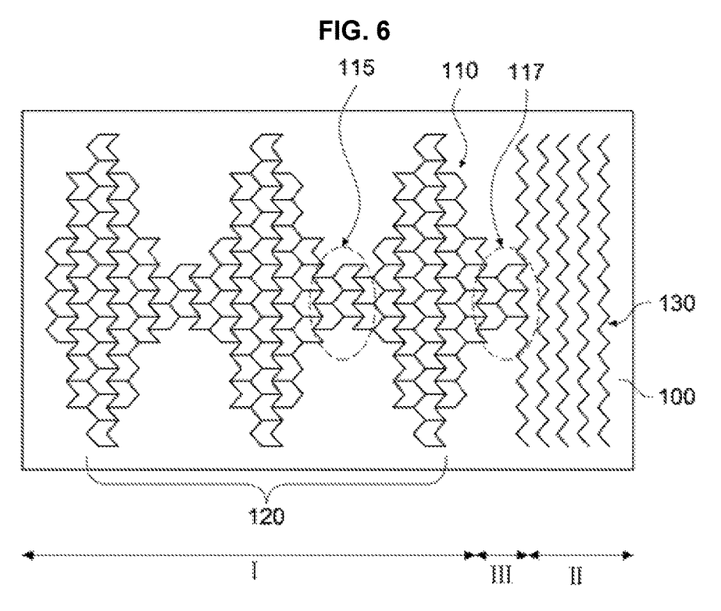
FIGS. 6 and 7 are schematic top plane views illustrating constructions of electrode cells and traces of touch sensing electrode structures in accordance with exemplary embodiments.
Figure 7:
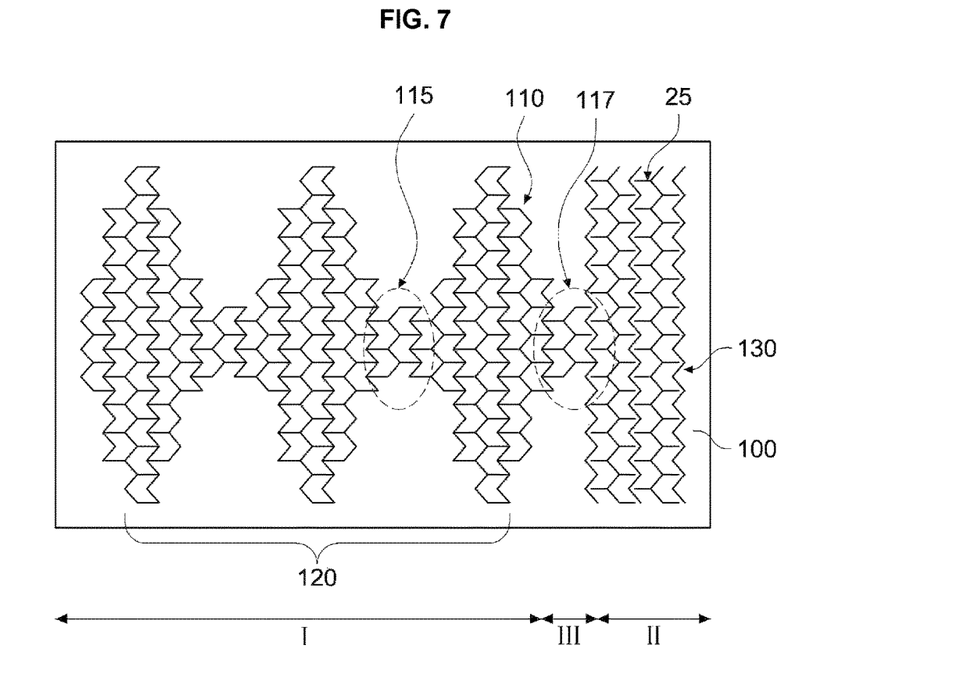

The electrode lines 10 may be distributed throughout the sensing region I, an intermediate region III and a trace region II (see FIGS. 6 and 7).

Referring to FIG. 2, a connecting electrode 20 may be interposed between the neighboring electrode lines 10. In exemplary embodiments, a concave polygonal pattern may be defined by the first electrode patterns 13, the second electrode patterns 15 and the connecting electrodes 20 neighboring each other. A plurality of the concave polygonal patterns may be arranged in a zigzag configuration.

For example, neighboring two concave polygonal patterns may commonly share one side, and a plurality of the concave polygonal patterns may be repeatedly arranged. Accordingly, the touch sensing electrode structure may include a mesh structure including the concave polygonal patterns.

In some embodiments, the concave polygonal pattern may be a concave hexagonal pattern. As illustrated in FIG. 2, the concave polygonal hexagonal pattern may be defined by two connecting electrodes 20 neighboring in the first direction, two first patterns 13 neighboring in the second direction, and two second patterns 15 neighboring in the second direction.

The concave polygonal pattern may include a convex portion 30 and a concave portion 35 facing in the second direction. In exemplary embodiments, the connecting electrode 20 may extend in the second direction such that the convex portion 30 and the concave portion 35 included in the neighboring concave polygonal patterns may be connected to each other.

A plurality of the connecting electrodes 20 may be arranged along the first direction to form a connecting electrode column, and a plurality of the connecting electrode columns may be formed along the second direction. The connecting electrodes 20 included in the neighboring connecting electrode columns may partially overlap along the first direction.

As described above, the concave polygonal patterns may be arranged in the zigzag mesh construction by the connecting electrodes 20 so that a density of patterns or electrodes connected to each other in a unit area may be increased while obtaining a desired aperture ratio.

In some embodiments, an inclined angle of the first electrode pattern 13 or the second electrode pattern 15 may be in a range from about 10° to about 70°, preferably from about 10° to about 50°.

The inclined angle may be defined as an angle formed by a virtual line extending in the second direction indicated by a dotted line in FIG. 2 and the first electrode pattern 13, or by the virtual line and the second electrode pattern 15. Within the range of the inclined angle, desired pattern density and aperture ratio may be achieved so that optical and electrical properties of a touch sensor including the touch sensing electrode structure may be improved.

The electrode line 10 and the connecting electrode 20 may be formed of the same conductive material. For example, the electrode line 10 and the connecting electrode 20 may include a metal wire or a transparent conductive oxide.

The metal wire may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), or an alloy thereof. These may be used alone or in a combination thereof.

The transparent conductive oxide may include indium tin oxide (ITO), indium zinc oxide (IZO), zinc oxide (ZnO), indium zinc tin oxide (IZTO), cadmium tin oxide (CTO), etc.

In exemplary embodiments, the electrode line 10 and the connecting electrode 20 may be formed of the metal wire which may have a resistance less than the transparent conductive oxide so that a signal transfer speed may be enhanced, and a flexible property may be also improved.

The touch sensing electrode structure may have the electrode arrangement and construction as described above. Thus, for example, when the touch sensing electrode structure is employed to an image display device such as a flexible display device, the pattern density in a unit area may be increased while obtaining the desired aperture ratio. Therefore, the electrodes or patterns may be effectively prevented from being seen by a user and a high touch sensing resolution may be realized.

Figure 3:
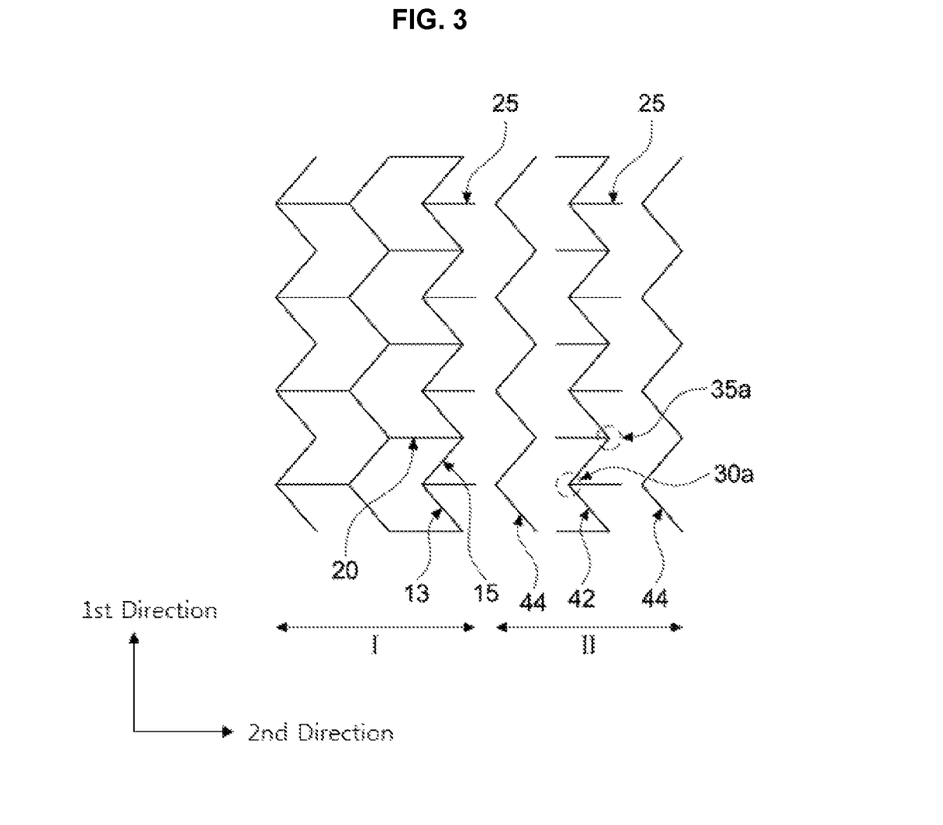
FIGS. 3 to 5 are schematic top plane views illustrating touch sensing electrode structures in accordance with some exemplary embodiments.
Figure 4:
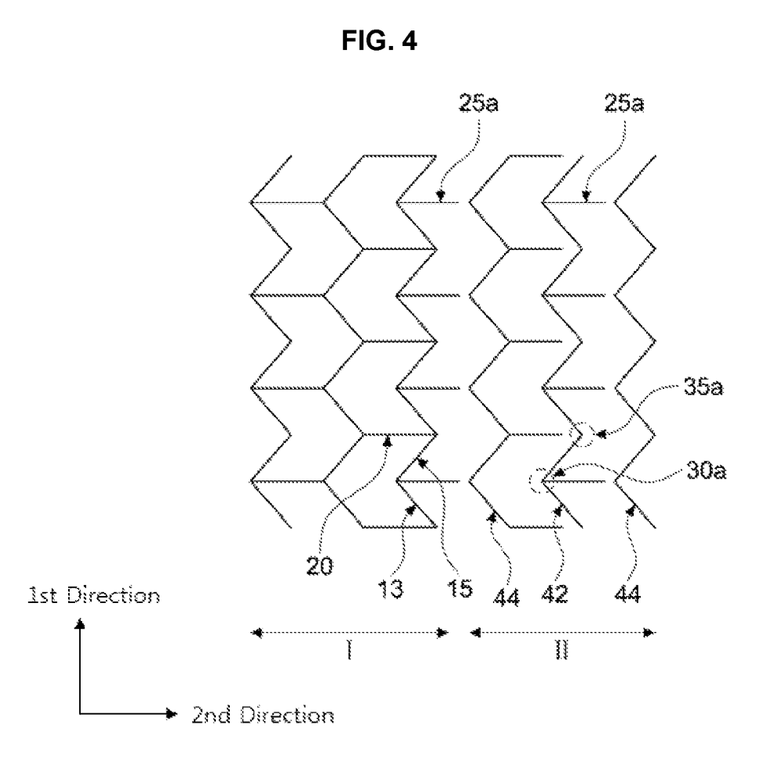
Figure 5:
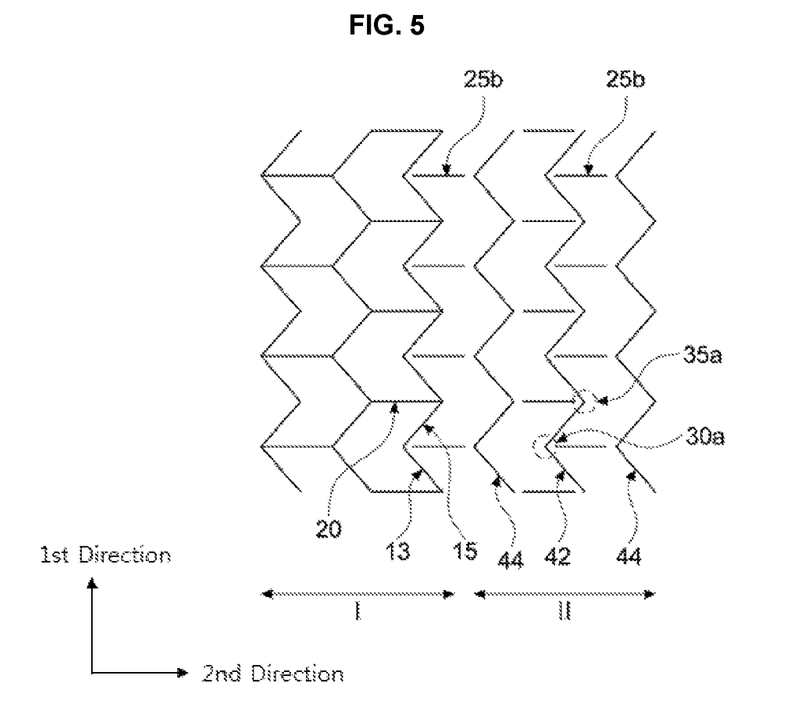

FIGS. 3 to 5 are schematic top plane views illustrating touch sensing electrode structures in accordance with some exemplary embodiments. For example, FIGS. 3 to 5 illustrate electrode pattern arrangements in a trace region.

Referring to FIG. 3, the electrode structure described with reference to FIG. 2 may be disposed in a sensing region I, and a plurality of traces 42 and 44 may be disposed in a trace region II.

The traces may be diverged from the electrode structure of FIG. 2 in the sensing region I to the trace region II. For example, a first trace 42 and a second trace 44 each may have a polygonal line shape or a zigzag line shape extending in the first direction. The first trace 42 and the second trace 44 may be alternately and repeatedly arranged along the second direction to be physically and electrically separated from each other.

Each trace may include the electrode line 10 illustrated in FIG. 1. According to exemplary embodiments of the present invention, a dummy electrode 25 may be disposed in the trace region II. The dummy electrode 25 may be disposed between the first trace 42 and the second trace 44 neighboring each other. The dummy electrode 25 may include the same material as that of the connecting electrode 20, and may be formed of a metal wire.

The dummy electrode 25 may be connected selectively to one of the first trace 42 or the second trace 44. For example, as illustrated in FIG. 3, the dummy electrode 25 may be selectively connected only to the first trace 42, and may be repeatedly arranged along the first direction.

In an implementation, as illustrated in FIG. 3, the dummy electrode 25 may be connected to each convex portion 30a and concave portion 35a included in the first trace 42. For example, the dummy electrode 25 may extend in the second direction from the first trace 42, and a plurality of the dummy electrodes 25 may be arranged in a zigzag configuration to partially overlap each other along the first direction.

The dummy electrode 25 may be physically and electrically separated or isolated from the second trace 44. The dummy electrode 25 may have a shape substantially the same as that of the connecting electrode 20 except that the dummy electrode 25 may be connected to only one electrode line 10. An electrode arrangement in the trace region II may be similar to that in the sensing region I by the first electrode patterns 13, the second electrode patterns 15 and the dummy electrodes 25 included in the traces 42 and 44. For example, concave polygonal patterns in which some sides are not connected to each other may be arranged in the trace region II.

In some embodiments, as illustrated in FIG. 3, the dummy electrode 25 may be also arranged at a boundary region between the sensing region I and the trace region II. Accordingly, the dummy electrode 25 may serve as a buffer pattern between the sensing region I and the trace region II.

Referring to FIG. 4, dummy electrodes 25a may be alternately connected to the first trace 42 and the second trace 44 along the first direction.

For example, the dummy electrodes 25a may be connected to each convex portion 30a of the first trace 42 and each concave portion 35a of the second trace 44.

Referring to FIG. 5, a dummy electrode 25b may be disposed between the first trace 42 and the second trace 44, and may be physically isolated from the first trace 42 and the second trace 44. For example, the dummy electrode 25b may have a floating electrode shape between the traces 42 and 44.

Accordingly, electrical properties of the traces may not be changed by the dummy electrode 25*b*.

In some embodiments, the dummy electrodes 25*b* arranged at the boundary region between the sensing region I and the trace region II may also have a floating electrode shape separated from adjacent electrode lines.

As described above, the dummy electrodes may be arranged in the trace region so that a pattern structure substantially the same as or similar to that in the sensing region may be implemented in the trace region while insulating the traces from each other. Thus, an electrode visibility and a moire phenomenon caused by a pattern structure deviation between the sensing region and the trace region may be prevented. Additionally, cracks and damages of the electrode lines or the traces in the trace region may be prevented or reduced by the dummy electrodes.

FIGS. 6 and 7 are schematic top plane views illustrating constructions of electrode cells and traces of touch sensing electrode structures in accordance with exemplary embodiments.

Referring to FIG. 6, the touch sensing electrode structure may be formed on, e.g., a substrate layer 100, and may include electrode cells 120 and traces 130 formed by patterning a mesh structure as described with reference to FIGS. 1 and 2.

The substrate layer 100 may be divided into a sensing region I, an intermediate region III, and a trace region II. In exemplary embodiments, the electrode cell 120 may be formed on the sensing region I of the substrate layer 100, and a plurality of unit cells 110 may be integrally connected to define the electrode cell 120. For example, the plurality of the unit cells 110 may be connected to each other by a merging portion 115 to form the electrode cell 120.

Electrode patterns and connecting electrodes as described with reference to FIGS. 1 and 2 may be included in each unit cell 110. For example, a mesh structure including the electrode patterns and the connecting electrodes may be patterned as a polygonal shape to form the unit cell 110.

Concave polygonal patterns included in the mesh structure may be assembled in an entirely convex polygonal shape such as a diamond or a rhombus shape to define the unit cell 110. A plurality of the unit cells 110 may be arranged along the second direction and may be connected to each other by the merging portion 115 so that each electrode cell 120 may have a substantially concave polygonal shape.

FIG. 6 illustrates only one electrode cell 120, however, a plurality of the electrode cells 120 may be arranged to be physically and electrically separated from each other in an interlocking configuration.

Further, traces 130 including electrode lines 10 as illustrated in FIG. 1 may be formed on the trace region II of the substrate layer 100. In some embodiments, the trace 130 may consist of the electrode lines 10 (see FIG. 1), and may have a polygonal line shape or a zigzag line shape extending in the first direction. The trace 130 may serve as a wiring such as a position detecting line of a touch sensor, and a plurality of the traces 130 may be assembled in a pad area (not illustrated) to be electrical connected to a driving circuit. A length and/or an inclined angle of the electrode patterns included in the trace 130 may be substantially the same of those of the electrode patterns included in the electrode cell 120 or the unit cell 110.

For example, each trace 130 may be electrically connected to one electrode cell among the electrode cells 120 disposed on the sensing region I.

The intermediate region III may be located between the sensing region I and the trace region II, and may serve as a buffer region between the two regions.

In some embodiments, a connecting portion 117 having a construction substantially the same as or similar to that of the merging portion 115 may be disposed on the intermediate region III, and some of the electrode lines 10 (see FIG. 1) may be also arranged on the intermediate region III. At least one of concave polygonal patterns included in the connecting portion 117 may include the dummy electrode 25.

For example, some of the electrode lines arranged on the intermediate region III may serve as a dummy line, and other electrode lines 120 may serve as the trace connected to the electrode cell 120.

The construction or the shape of the unit cell 110 or the electrode cell 120 illustrated in FIG. 6 is provided as one example, and the shape of the unit cell 110 and the number of the unit cells 110 included in the electrode cell 120 may be properly adjusted in consideration of a touch sensor design or a circuit design.

According to exemplary embodiments as described above, the electrode cell 120 may include a plurality of the unit cells 110 having the substantially convex polygonal shape. Thus, a resistance or capacitance deviation based on touched areas may be increased compared to that in an electrode cell having a simple polygonal shape (e.g., a diamond shape) so that a touch sensing resolution may be improved.

The substrate layer 100 may include a film substrate that may serve as a base layer for forming the touch sensing electrode structure. For example, the substrate layer 100 may include a film material commonly used in the touch sensor, e.g., glass, polymer and/or an inorganic insulation material. The polymer may include, e.g., cyclo olefin polymer (COP), polyethylene terephthalate (PET), polyacrylate (PAR), polyether imide (PEI), polyethylene naphthalate (PEN), polyphenylene sulfide (PPS), polyallylate (polyallylate), polyimide (PI), cellulose acetate propionate (CAP), polyether sulfone (PES), cellulose triacetate (TAC), polycarbonate (PC), cyclo olefin copolymer (COC), polymethylmethacrylate (PMMA), etc. The inorganic insulation material may include, e.g., silicon oxide, silicon nitride, silicon oxynitride, a metal oxide, etc.

Referring to FIG. 7, as described with reference to FIGS. 3 to 5, dummy electrodes 25 may be arranged on the trace region II such that an insulation between the traces 130 may be maintained. The dummy electrodes 25 may be also arranged at a boundary region between the sensing region I and the trace region II to serve as buffer patterns. The traces 130 extending individually from the electrode cells 120 may be physically and electrically separated from each other. For example, the dummy electrodes 25 may be disposed between the traces 42 and 44 neighboring each other to be selectively connected to one of the neighboring traces.

Figure 8:
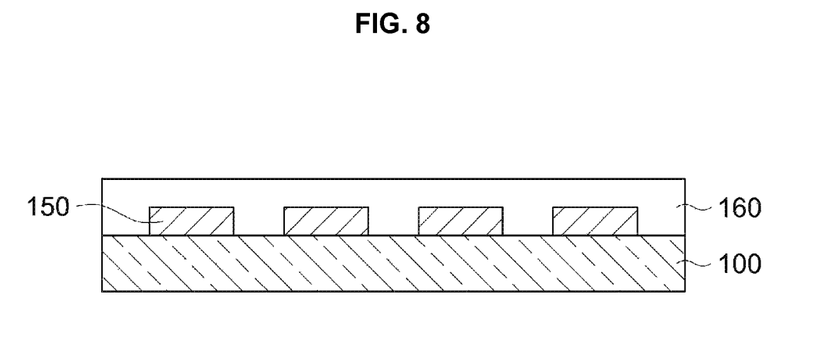
FIG. 8 is a schematic cross-sectional view illustrating a touch sensor in accordance with exemplary embodiments.
Figure 9:
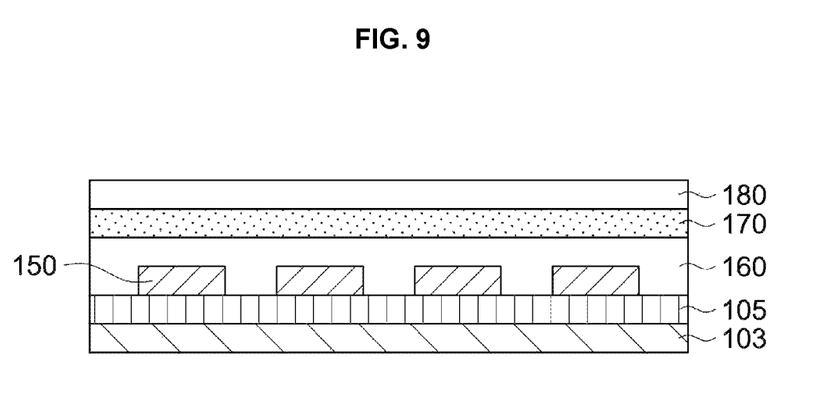
FIG. 9 is a schematic cross-sectional view illustrating a touch sensor in accordance with exemplary embodiments.

FIGS. 8 and 9 are schematic cross-sectional views illustrating touch sensors in accordance with exemplary embodiments.

Referring to FIG. 8, the touch sensor may include a substrate layer 100, a touch sensing electrode structure 150 and an insulation layer 160.

The substrate layer 100 may be substantially the same as that described with reference to FIGS. 6 and 7. The touch sensing electrode structure 150 as described with reference to FIGS. 1 to 5 may be formed on the substrate layer 100.

The insulation layer 160 may be formed on the substrate layer 100 to at least partially cover the touch sensing electrode structure 150. The insulation layer 160 may be formed of a transparent insulation material. For example, an inorganic insulation material such as silicon oxide or a transparent organic material such as an acryl-based resin may be used to form the insulation layer 160.

In some embodiments, the insulation layer 160 may include an over-coating layer entirely covering the touch sensing electrode structure 150.

In exemplary embodiments, the touch sensor may be a self-capacitance type. In this case, the touch sensing electrode structure 150 may be formed substantially at a single layer or a single level, and the trace 130 may be formed per each electrode cell 120 (see FIGS. 6 and 7). Thus, a bridge electrode included in, e.g., a mutual-capacitance type touch sensor may be omitted so that a flexible thin-layered touch sensor may be easily realized.

Referring to FIG. 9, the touch sensor may be provided as a film-type or a substrate-less type sensor.

For example, the touch sensor may include a separation layer 103, a protective layer 105, a touch sensing electrode structure 150, an insulation layer 160, an adhesive layer 170 and a protective film 180.

The separation layer 103 may include a polymer organic layer, may include, e.g., a polyimide-based polymer, a poly vinyl alcohol-based polymer, a polyamic acid-based polymer, a polyamide-based polymer, a polyethylene-based polymer, a polystyrene-based polymer, a polynorbornene-based polymer, a phenylmaleimide-based polymer, a polyazobenzene-based polymer, a polyphenylenephthalamide-based polymer, a polyester-based polymer, a polymethyl methacrylate-based polymer, a polyarylate-based polymer, a cinnamate-based polymer, a coumarin-based polymer, a phthalimidine-based polymer, a chalcone-based polymer, an aromatic acetylene-based polymer, etc. These may be used alone or in a combination thereof.

In some embodiments, the separation layer 103 may be formed on a carrier substrate (not illustrated) such as a glass substrate and may facilitate a detaching process of the carrier substrate after forming the touch sensing electrode structure 150.

The protective layer 105 may be formed on the separation layer 103, and may be provided for a protection of the touch sensing electrode structure 150 and a refractive index matching of the touch sensor. The protective layer 105 may be formed of an inorganic insulation material such as silicon oxide, silicon nitride, silicon oxynitride, etc., or a polymer-based organic insulation material. In some embodiments, the protective layer 105 may be omitted.

The touch sensing electrode structure 150 according to exemplary embodiments as described above may be formed on a lower layer including the separation layer 103 and/or the protective layer 105, and the insulation layer 160 covering the touch sensing electrode structure 150 may be formed.

In some embodiments, the adhesive layer 170 may be formed on the insulation layer 160, and the protective film 180 may be attached on the adhesive layer 170.

The protective film 180 may include a transparent resin film which may include, e.g., cellulose ester (e.g., cellulose triacetate, cellulose propionate, cellulose butyrate, cellulose acetate propionate and nitro cellulose), polyimide, polycarbonate, polyester, polyethylene terephthalate, polystyrene, polyolefin, polysulfone, polyether sulfone, polyarylate, polyether-imide, polymethylmethacrylate, polyether ketone, polyvinyl alcohol, poly vinyl chloride, etc. These may be used alone or in a combination thereof.

The protective film 180 may be detached in a subsequent process to obtain a thin touch sensor film. In some embodiments, the touch sensor may further include an optical functional film such as a polarizing film, a retardation film, etc.

Figure 10:
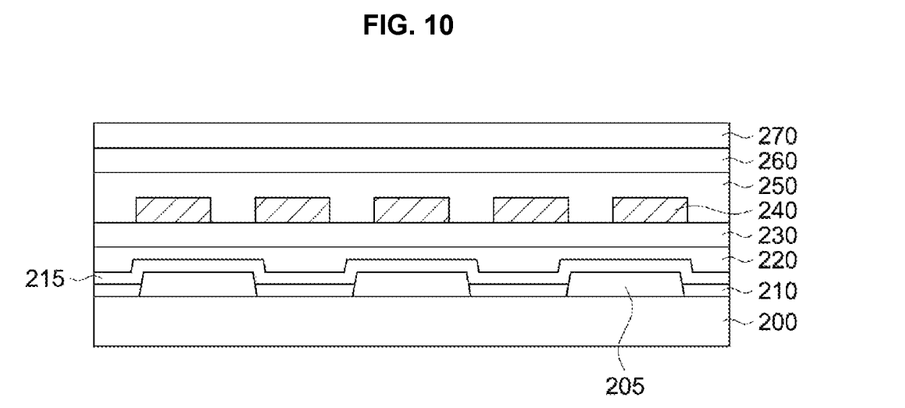
FIG. 10 is a schematic cross-sectional view illustrating an image display device in accordance with exemplary embodiments.

FIG. 10 is a schematic cross-sectional view illustrating an image display device in accordance with exemplary embodiments.

Referring to FIG. 10, the image display device may include a base substrate 200, a pixel defining layer 205, a display layer 210, an electrode 215, insulating interlayers 220 and 230, a touch sensing electrode structure 240, a protective layer 250, an optical layer 260 and a window substrate 270.

The base substrate 200 may be a support substrate of the image display device. In exemplary embodiments, the base substrate 200 may include a flexible resin material such as polyimide. In this case, the image display device may be a flexible display device.

The pixel defining layer 205 may be formed on the base substrate 200 such that a pixel region implementing a color, or an image may be exposed. A thin film transistor (TFT) array may be formed between the base substrate 200 and the pixel defining layer 205, and an insulation structure covering the TFT array may be formed. The pixel defining layer 205 may be formed on the insulation structure such that a pixel electrode (e.g., an anode) formed through the insulation structure and electrically connected to the TFT may be exposed.

The display layer 210 may be formed on each pixel region exposed by the pixel defining layer 205. For example, the display layer 210 may include an organic light emitting material, and the image display device may be an OLED display device. The display layer 210 may include a liquid crystal material, and the image display device may be an LCD device.

The electrode 215 may be disposed on the pixel defining layer 205 and the display layer 215. The electrode 215 may serve as an opposing electrode facing the pixel electrode. The electrode 215 may be a cathode of the image display device, and may serve as a common electrode continuously extending on a plurality of the pixel regions.

The insulating interlayers 220 and 230 may be formed on the electrode 215. The insulating interlayers 220 and 230 may include a first insulating interlayer 220 and a second insulating interlayer 230. The first insulating interlayer 220 may serve as a leveling layer, and the second insulating interlayer 230 may serve as an encapsulation layer.

The touch sensing electrode structure 240 according to exemplary embodiments may be disposed on the insulating interlayer. For example, a metal wire may be directly deposited on the second insulating interlayer 230, and then may be patterned to form the touch sensing electrode structure 240. In some embodiments, the touch sensing electrode structure 240 may be fabricated as the touch sensor as described with reference to FIG. 8 or 9 to be included in the image display device, The touch sensing electrode structure 240 may be a self-capacitance type, and may be included in the image display device as a substantially single-layered or single-leveled member. Thus, an interference or a noise due to an interaction with the electrode 215 in a mutual-capacitance type touch sensor may be avoided or reduced.

As described with reference to FIGS. 1 and 2, the touch sensing electrode structure 240 may effectively prevent electrodes from being visually seen or observed, and thus may be distributed commonly on the pixel defining layer 205 and the pixel region. In some embodiments, the touch sensing electrode structure 240 may overlap the pixel defining layer and may not overlap the pixel regions.

Further, the touch sensing electrode structure 240 may include an assembled structure of concave polygonal patterns. Thus, a moire phenomenon caused by an optical interference with electrodes or wiring of a display panel may be effectively suppressed compared to a simple diamond-mesh type electrode structure.

In some embodiments, as described with reference to FIGS. 3 to 5, the touch sensing electrode structure 240 may include dummy electrodes in a trace region to further prevent the electrodes from being seen and avoid the moire phenomenon and to have enhanced transmittance and aperture ratio. Thus, the touch sensing electrode structure 240 may be distributed commonly on the pixel defining layer 205 and the pixel region.

The protective layer 250 may be formed on the second insulating interlayer 230 to cover the touch sensing electrode structure 240, and the optical layer 260 and the window substrate 270 may be formed on the protective layer 250.

The optical layer 260 may include a functional layer for improving an optical property such as a transmittance of the image display device, e.g., may include a polarizer or a polarizing plate, a retardation film, etc. The window substrate 270 may also serve as an encapsulation layer exposed toward a user.

The touch sensing electrode structure 240 according to exemplary embodiments may be applied to, e.g., a flexible OLED display device to improve a touch resolution, a transmittance, a flexible property, etc., of the image display device from the above-described construction of electrodes, patterns and/or cells.

Hereinafter, preferred embodiments are proposed to more concretely describe the present invention. However, the following examples are only given for illustrating the present invention and those skilled in the related art will obviously understand that various alterations and modifications are possible within the scope and spirit of the present invention. Such alterations and modifications are duly included in the appended claims.

EXAMPLES AND COMPARATIVE EXAMPLES

Examples

A mesh structure having a construction illustrated in FIG. 2 was formed on a COP substrate layer using an alloy (APC) of silver (Ag), palladium (Pd) and copper (Cu). A line-width of an electrode was 3 μm, an electrode thickness was 90 nm, and a length of each electrode pattern (a first electrode pattern and a second electrode pattern) and a connecting electrode was controlled based on an inclined angle in a range from 54.549 μm (5°) to 49.579 μm (75°).

The inclined angle (θ) designated in FIG. 2 was changed to form touch sensing electrode structure of Examples.

Comparative Example

A mesh structure was formed on the COP substrate layer the same as that of Examples using APC to include repeated diamond patterns (or rhombus patterns). A lie-width of an electrode was 3 μm, an electrode thickness was 90 nm, and lengths of two diagonal lines of each diamond pattern were 59.55 μm and 75 μm.

Experimental Example (1) Measurement of Transmittance

Transmittances of the mesh structures of Examples and Comparative Example were measured using a spectro-colorimeter (CM-3600A, Konica Minolta) in a wavelength of 550 nm.

(2) Measurement of Channel Resistance

Channel resistances of the mesh structures of Examples and Comparative Example were measured using a resistance measuring device (87V, FLUKE).

(3) Evaluation of Visibility

The mesh structures of Examples and Comparative Example were visually observed to evaluate visibility of the electrode patterns. Specifically, ten panels viewed the mesh structures, and the visibility of the electrode patterns were evaluated by the number of panels who determined that the electrode patterns were clearly seen among the ten panels.

The results are shown in Table 1 below.

TABLE 1

| | | Inclined Angle (°) | Transmittance (%) | Channel Resistance (KΩ) | Visibility |
|---|---|---|---|---|---|
| Examples | 1 | 5 | 90.55 | 556.24 | 7/10 |
| | 2 | 10 | 90.47 | 557.40 | 3/10 |
| | 3 | 15 | 90.15 | 556.24 | 2/10 |
| | 4 | 20 | 90.14 | 557.40 | 0/10 |
| | 5 | 22.5 | 90.02 | 581.55 | 0/10 |
| | 6 | 25 | 89.92 | 592.83 | 0/10 |
| | 7 | 45 | 88.19 | 759.84 | 0/10 |
| | 8 | 50 | 87.21 | 835.88 | 0/10 |
| | 9 | 60 | 84.32 | 1074.57 | 0/10 |
| | 10 | 65 | 81.95 | 1271.22 | 0/10 |
| | 11 | 69 | 79.29 | 1498.68 | 0/10 |
| | 12 | 71 | 77.42 | 1649.83 | 0/10 |
| | 13 | 75 | 72.29 | 2075.79 | 0/10 |
| Comparative Example | | — | 84.19 | 956.66 | 9/10 |

Referring to Table 1, the mesh structures of Examples showed generally reduced channel resistances and improved visibility relatively to that of Comparative Example having the diamond-type mesh structure. In the mesh structures of Examples, the electrode patterns were connected by the connecting electrodes as a concave polygonal shape so that an electrode area was increased, and electrode visibility was remarkably reduced compared to the conventional diamond mesh structure.

In Example 12 and 13 having the inclined angles exceeding 70°, a density of the electrode patterns was increased, and the transmittances were slightly decreased. In Examples 9 to 13 having the inclined angles exceeding 50°, a bending angle was increased, and the channel resistances were slightly increased.

In Example 1 having the inclined angle less than 10°, the electrode visibility was slightly increased compared to those in other Examples.

From the results above, within the inclined angle in a range from about 10° to about 70°, preferably 10° to 50°, the electrode patterns were effectively prevented from being seen while maintaining preferable transmittance and channel resistance.

What is claimed is:
1. A touch sensing electrode structure, comprising:
a plurality of electrode lines each extending in a first direction as a zigzag line shape, the plurality of the electrode lines being arranged along a second direction that crosses the first direction, the plurality of electrode lines each comprising a first electrode pattern and second electrode pattern which are alternately repeated to form the zigzag line shape; and connecting electrodes which extend straight in the second direction and electrically connect neighboring ones of the electrode lines to form a plurality of concave hexagonal patterns, the concave hexagonal patterns each defined by two neighboring first electrode patterns facing each other, two neighboring second electrode patterns facing each other, and two neighboring connecting electrodes facing each other, wherein the touch sensing electrode structure is a self-capacitance type to be provided as a unit cell of a self-capacitance type touch sensor.

2. The touch sensing electrode structure according to claim 1, wherein the concave hexagonal pattern includes a convex portion and a concave portion defined at intersecting regions of the first electrode pattern and the second electrode pattern; and the connecting electrode connects the convex portion and the concave portion included in neighboring ones of the concave polygonal patterns.

3. The touch sensing electrode structure according to claim 1, wherein an inclined angle of the first electrode pattern or the second electrode pattern relative to the first direction is in a range from 10° to 70°.

4. The touch sensing electrode structure according to claim 3, wherein the inclined angle is in a range from 10° to 50°.

5. The touch sensing electrode structure according to claim 1, wherein a mesh structure is defined by the electrode lines and the connecting electrodes; and the mesh structure is patterned into an electrode cell including a plurality of merged unit cells.

6. The touch sensing electrode structure according to claim 5, wherein each unit cell has a convex polygonal shape, and the electrode cell has a concave polygonal shape.

7. The touch sensing electrode structure according to claim 5, further comprising traces electrically connected to each electrode cell.

8. The touch sensing electrode structure according to claim 7, wherein the trace includes at least one of the electrode lines, and there is no connecting electrode that connects neighboring ones of the electrode lines.

9. The touch sensing electrode structure according to claim 8, wherein the first electrode pattern and the second electrode pattern included in the trace have a length and an inclined angle the same as those of the first electrode pattern and the second electrode pattern included in the electrode cell.

10. The touch sensing electrode structure according to claim 7, further comprising dummy electrodes disposed between neighboring traces of the traces.

11. The touch sensing electrode structure according to claim 10, wherein the dummy electrode extends in the second direction.

12. The touch sensing electrode structure according to claim 10, wherein the dummy electrodes are connected to only one trace of the neighboring traces.

13. The touch sensing electrode structure according to claim 12, wherein the trace has a zigzag line shape extending in the first direction and including convex portions and concave portions alternately repeated; and the dummy electrodes are connected to each convex portion and each concave portion of the one trace.

14. The touch sensing electrode structure according to claim 10, wherein the dummy electrodes are arranged along the first direction to be alternately connected to the neighboring traces.

15. The touch sensing electrode structure according to claim 10, wherein the dummy electrodes are isolated from the neighboring traces.

16. A touch sensor comprising the touch sensing electrode structure according to claim 1.

17. An image display device comprising the touch sensing electrode structure according to claim 1.

\* \* \* \* \*